US006180936B1

(12) United States Patent
Haft

(10) Patent No.: US 6,180,936 B1
(45) Date of Patent: Jan. 30, 2001

(54) PHOTORECEPTOR ARRANGEMENT FOR RECEIVING LIGHT BEAMS HAVING COUPLING ELEMENTS

(75) Inventor: Michael Haft, München (DE)

(73) Assignee: Siemens Aktiengesellschaft, Munich (DE)

( * ) Notice: Under 35 U.S.C. 154(b), the term of this patent shall be extended for 0 days.

(21) Appl. No.: 09/230,536

(22) PCT Filed: Sep. 3, 1997

(86) PCT No.: PCT/DE97/01930

§ 371 Date: Jan. 27, 1999

§ 102(e) Date: Jan. 27, 1999

(87) PCT Pub. No.: WO98/10467

PCT Pub. Date: Mar. 12, 1998

(30) Foreign Application Priority Data

Sep. 3, 1996 (DE) .............................................. 196 35 755

(51) Int. Cl.$^7$ ...................................................... H01L 31/00
(52) U.S. Cl. .................................. 250/214.1; 250/214 P; 250/214 R
(58) Field of Search ........................... 250/214.1, 214 R, 250/214 LA, 214 LS, 221, 214 P; 348/302, 311, 309, 294; 396/111

(56) References Cited

U.S. PATENT DOCUMENTS 4,488,052   12/1984   Zappen et al. ........................ 250/578

FOREIGN PATENT DOCUMENTS 43 37 160 A1   4/1995   (DE) .

OTHER PUBLICATIONS

Andreou, A.G. et al, "Analog VLSI Neuromorphic Image Acquisition and Pre–Processing Systems", Neural Networks, vol. 8, No. 7/8, Jan. (1995), pp. 1323–1347.
Delbrueck, T., "Silicon Retina with Correlation–Based, Velocity–Tuned Pixels", IEEE Transactions on Neural Networks, vol. 4, No. 3, May (1993), pp. 529–541.
Johansson, T. et al, "A Three–Dimensional Architecture for a Parallel Processing Photosensing Array", IEEE Transactions on Biomedical Engineering, vol. 39, No. 12, Dec. (1992), p. 1292–1297.
Chung–Yu Wu et al, "A New Structure of the 2–D Silicon Retina", IEEE Journal of Solid–State Circuits, vol. 30, No. 8, Aug. (1995), PP. 890–897.
Heeger, A.J. et al, "Image Enhancement with Polymer Grid Triode Arrays", Science, vol. 270, No. 5242, Dec. (1995), pp. 1642–1644.
Mahowald, M.A. et al, "The Silicon Retina", Scientific American (International Edition), May (1991), vol. 264, No. 5, pp. 40–46.
Boahen, K.A. et al, A Contrast Sensitive Silicon Retina with Reciprocal Synapses, (1992), Advances in Neural Information Processing Systems 4, J. Moody et al, (eds.), pp. 764–772. (Month Unknown).
Wolpert, Seth et al, "Silicon Models of Lateral Inhibition", IEEE Transactions on Neural Networks, vol. 4, No. 6, Nov. (1993), pp. 955–961.

Primary Examiner—Que T. Le
(74) Attorney, Agent, or Firm—Schiff Hardin & Waite

(57) ABSTRACT

The photoreceptor arrangement has at least two photoreceptors (P) with which light rays are registered and converted into electrical signals. The photoreceptors (P) are coupled to one another, whereby the couplings (K) of the photoreceptors (P) are couplings.

10 Claims, 1 Drawing Sheet

PHOTORECEPTOR ARRANGEMENT FOR RECEIVING LIGHT BEAMS HAVING COUPLING ELEMENTS

BACKGROUND OF THE INVENTION

Photoreceptors convert received light rays into an analog electrical signal that can be digitalized. For example, photoreceptors can be situated in a digital camera that registers an arbitrary image in analog form, is digitalized following the photoreceptors and is further-processed in digitalized form, for example in a computer. However, the photoreceptors can also be utilized as an independent sensor system independently of a video camera, for example in image processing. A further employment of photoreceptors can be seen in a realization of what is referred to as a technical eye.

Various photoreceptor arrangements are known under the research term of silicone retina and are discussed in the following prior art references: K. Boahen and A. Andreou, A Contrast Sensitive Silicon Retina with Reciprocal Synapses, Advances in Neural Information Processing Systems 4, J. Moody et al. (eds.), San Mateo, pp. 764–772, (1992); J. Heeger et al., Image Enhancement with Polymer Grid Triode Arrays, Science, Vol. 270, pp. 1642–1644, (1995); M. Mahowald and C. Mead, The Silicon Retina, Scientific American, Vol. 164, pp. 40–46, (1991); S, Wolpert and E. Micheli-Tsanakou, Silicon Models of lateral Inhibition, IEEE Transactions on Neural Networks, Vol. 4, pp. 955–961, (1993); and Wu Chung-Yu and Chiu Chin-Fong, A New Structure of the 2-D Silicon Retina, IEEE Journal of Solid-State Circuits, Vol. 30, No. 8, pp. 890–897, (1995).

In the photoreceptor arrangements described therein, with which the retina of vertebrates is to be simulated, it is also known to embed the photoreceptors in a network. As a result of this procedure, it is beginning to become possible to implement a filtering of the registered image information. In said works, the coupling of the photoreceptors ensues mainly with the goal of intensifying contrast.

The known arrangements, however, exhibit some disadvantages and deliver only unsatisfactory results. In particular, the couplings in the cited networks are fixed and not fashioned variable dependent, for example, on the illumination intensity of the photoreceptor arrangement. These models can thus only be meaningfully employed in a small range of an illumination intensity predetermined by the coupling intensities.

The reference of J. Heeger et al., Image Enhancement with Polymer Grid Triode Arrays, Science, Vol. 270, pp. 1642–1644, (1995), also discloses that the photoreceptors be coupled to one another not by a network but via a substrate of fixed conductivity.

A Oppenheim and A. Willsky, Signale und Systeme, $2^{nd}$ Edition, VCH Verlagsgesellschaft, ISBN 3-527-28433-8, pp. 347–383, (1992), discloses various filter structures of digital filters.

The German reference DE 43 37 160 A1, discloses a photodetector array. The photodetector array comprises a plurality of photodetector elements regularly arranged in a surface. At least two layers, layers A and B, are provided, whereby the photodetector elements are arranged in the first layer A facing toward the light incidence and are directly connected to one another via paths of controllable electrical conductivity, for example channels of MOS transistors. Further circuit elements are accommodated in a second layer arranged coplanar with the first.

SUMMARY OF THE INVENTION

The invention is based on the problem of specifying a photoreceptor arrangement that avoids the disadvantages of the known arrangements.

In general terms the present invention is a photoreceptor arrangement for the reception of light rays. At least two photoreceptors are provided with which light rays that impinge the photoreceptor arrangement are registered and converted into electrical signals. The photoreceptors are coupled to one another. The coupling of the photoreceptors is a variable coupling. At least one coupling element that is respectively coupled to an output of the corresponding photoreceptor is provided for at least a part of the photoreceptors. The coupling elements are variably coupled to one another. An output of at least a part of the coupling elements are coupled to a first input of a respective adder unit. At least a part of the outputs of the corresponding photoreceptors are coupled to a second input of the adder unit.

Advantageous development of the present invention are as follows.

The coupling of the photoreceptors is dependent on the luminous intensity of the light rays incident onto the arrangement. The coupling of the photoreceptors becomes more intense with decreasing luminous intensity.

The coupling of the photoreceptors is dependent on the signal-to-noise ratio of the light rays incident onto the arrangement. The coupling of the photoreceptors becomes more intense with decreasing signal-to-noise ratio.

The coupling of the photoreceptors is dependent on the semantics of an image that is formed by the light rays.

The photoreceptors are respectively arranged at the same spacing from one another.

A respective photoreceptor are coupled only to photoreceptors in a surround of the respective photoreceptor having a prescribable size. In a further embodiment a respective photoreceptor is coupled only to photoreceptors arranged directly neighboring.

A substrate is provided via which the photoreceptors are coupled to one another. The substrate comprises a variable conductivity.

The coupling of the coupling elements to the first input of the adder unit is respectively fashioned such that output signals of the coupling elements are supplied to the adder unit inverted and arbitrarily weighted.

In another embodiment the arrangement is utilized in a video chip.

At least two photoreceptors that are coupled to one another are provided in the inventive photoreceptor arrangement, whereby the coupling of the photoreceptors is fashioned variable.

As a result of the variable coupling of the photoreceptors, it is possible to meaningfully employ the arrangement in a significantly greater range of illumination intensities.

A further advantage of the invention is to be seen therein that the photoreceptor arrangement proposes a processing strategy that allows a multitude of different high passes and low passes to be realized by variable coupling parameters. An adaptation of the photoreceptor arrangement to the ambient conditions of the photoreceptor arrangement, for example to the illumination intensity, thus becomes possible.

It is advantageous to fashion the coupling of the photoreceptors dependent on the luminous intensity of the light rays incident onto the arrangement such that the coupling of the photoreceptors becomes greater with decreasing luminous intensity and less with increasing luminous intensity. An automatic "matching" of the photoreceptor arrangement to the respective applied situation, particularly to the brightness of the surroundings in which the photoreceptor arrangement is utilized, is achieved by this automatic coupling of the photoreceptors dependent on the luminous intensity.

It is also advantageous to arrange the photoreceptors at the respectively same spacing from one another, a grid structure of the photoreceptors within the arrangement being thus realized. This leads to an arrangement that is uniform and, thus, simpler to handle in dimensioning. The fabrication of the photoreceptor arrangement in grid structure is also considerably more cost-beneficial compared to irregularly arranged photoreceptors.

Particularly given electrical coupling of the photoreceptors via electrical lines, it is advantageous to respectively couple only one photoreceptor with neighboring photoreceptors in a surround of the respective photoreceptor of prescribable size, advantageously only with photoreceptors that are respectively arranged directly adjacent. It has been shown that this development does not lead to greater quality losses but does lead to substantial cost savings in the production of the arrangement.

When the photoreceptors are coupled to one another the arrangement is advantageous since it closely approximates the properties of the human eye. The photoreceptor arrangement is also substantially improved as a result of this arrangement.

By employing the arrangement in a video chip, it becomes possible achieved at least a great part of the image pre-processing integrated on a chip with a considerable reduction of the required calculating performance since, due to the analog processing strategy wherein the noise contained in the registered signal is already reduced to a substantial degree in the first processing level, the level of the photoreceptors, and the digitalization ensues on a signal wherein a part of the noise was already eliminated.

The actual image processing, which requires considerable calculating outlay, thus ensues on an electrical signal that is already "noise-reduced".

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENT

Figure 1:
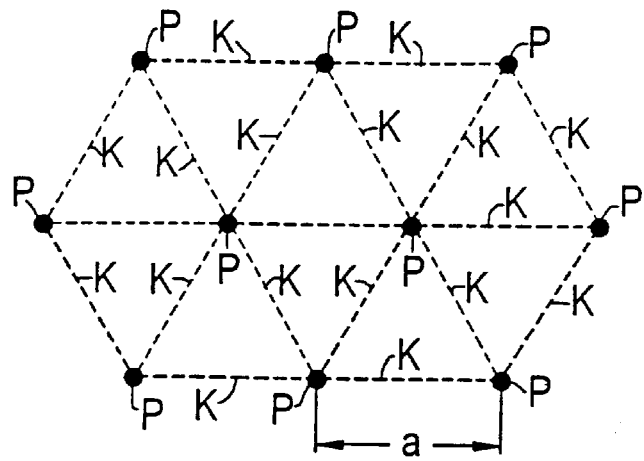
FIG. 1 is a sketch of a photoreceptor arrangement shown by way of example.
Figure 2:
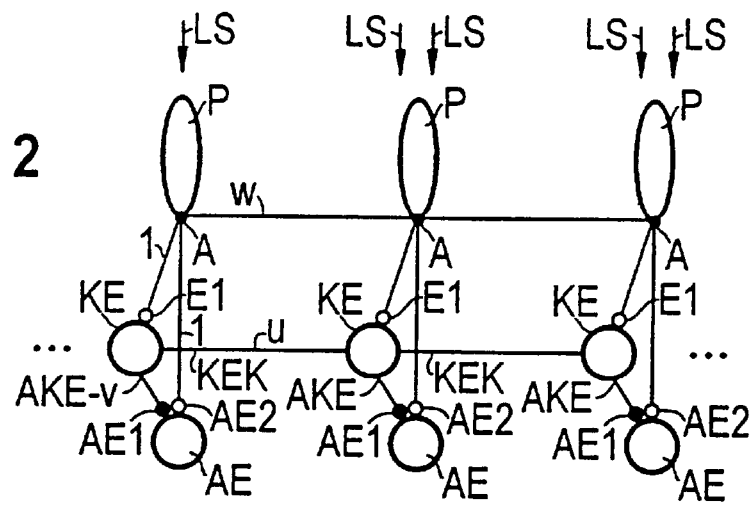
FIG. 2 depicts a development of the photoreceptor arrangement.

FIG. 1 shows an example of a photoreceptor arrangement. An arbitrary plurality of photoreceptors P are arranged next to one another in the photoreceptor arrangement. The photoreceptors P are coupled to one another via couplings K. Light rays LS (see FIG. 2) incident onto the photoreceptors P are registered by the photoreceptors p and converted into electrical signals.

"Lateral interactions" between the individual photoreceptors P are realized by the couplings K. Dependent on the degree of the lateral interaction, differences in the receptor voltages are thus compensated to different extents.

An analog image that is formed by the light rays LS incident onto the photoreceptors P is smoothed by the lateral interactions, i.e. by the couplings K between the photoreceptors P. The photoreceptor arrangement thus represents a low pass for the original image registered by the photoreceptor arrangement.

The electrical signals that the photoreceptors P make available for further-processing and that thus represent the image are further-processed in an arbitrary way, for example in the scope of a digital image processing.

The lateral interaction between the couplings K can be presented in the following way in mathematical expressions. A luminous intensity of a photoreceptor P at a position x is referenced with $\xi_x$ in the following rule.

Assuming linear relationships, the dynamics of the photoreceptor arrangement can be described by the following rule:

$$\frac{d\alpha_x}{dt} = -r \cdot \alpha_x + w \cdot \sum_{y \in NN(x)} \alpha_y + \xi_x. \tag{1}$$

$\alpha_x$ references an output signal of the photoreceptor P at the respective position x. Due to the coupling K, the photoreceptor P at the position x is influenced not only by the external signal $\xi_x$, for example the luminous intensity, but output signals of the neighboring photoreceptors P are also taken into consideration dependent on the size of an interaction intensity w.

A photoreceptor P that is coupled by a coupling K to the respective photoreceptor P whose output signal $\alpha_x$ is respectively unambiguously described in position with an index y. NN(x) references the entire set of photoreceptors P coupled to the respective photoreceptor P by coupling K. A freely prescribable time integration constant is described with r.

The couplings K can extend over an arbitrary set of photoreceptors. It is thus definitely not required—as indeed shown in FIG. 1—that only directly neighboring photoreceptors P are respectively coupled to one another.

In a development, however, it is provided to respectively consider only a prescribable area around a respective photoreceptor P and, thus, to also only consider a specific, other photoreceptors P located around the photoreceptor P according to the prescribable area in the rule (1). A considerable saving of outlay and costs in the production of the overall photoreceptor arrangement is achieved by this development. This effect is improved further in a development of the arrangement in that only directly neighboring photoreceptors P are respectively coupled to the respective photoreceptor P and, thus, are also only considered in the rule (1).

The position of the photoreceptors p is also arbitrary. In a development of the photoreceptor arrangement, however, it is advantageous, particularly for simple presentability of the properties of the photoreceptor arrangement, that the photoreceptors p are arranged in an array, i.e. a grid. In this way, the photoreceptors P are respectively arranged at the same spacing from one another. In this development, a spacing between the respective photoreceptors P is referenced with a symbol a.

By transformation of the rule (1) into the frequency space, one obtains the following description in the frequency space for rule (1):

$$\frac{d\alpha(k)}{dt} = -r \cdot \alpha(k) + w \cdot \alpha(k) \cdot J_0(a\|k\|) + \xi(k). \tag{2}$$

In rule (2), k references a spatial frequency, a references the spacing between the photoreceptors P—this spacing is referred to a grid constant a given regular spacings—and $J_0$ references the $0^{th}$ Bessel function.

Fixed points of rule (2) correspond to the response behavior of the photoreceptor arrangement $G_{NN}^{w}(k)$ for the stationary case. The response behavior $G_{NN}^{w}(k)$ is then established by the following rule:

$$\alpha(k) = G_{NN}^{w}(k) \cdot \xi(k) = \frac{1}{1 - w \cdot J_0(a\|k\|)}. \quad (3)$$

For positive values of the interaction intensity w, this response behavior $G_{NN}^{w}(k)$ describes a low pass.

The interaction intensity w of the couplings K between the photoreceptors P is fashioned variable in the photoreceptor arrangement.

In a development of the photoreceptor arrangement, it is advantageous to variably adapt the interaction intensity w dependent on the luminous intensity $\xi_x$ of the light rays LS that impinge the photoreceptors P. It is thereby advantageous to reduce the interaction intensity w with increasing luminous intensity $\xi_x$. With decreasing luminous intensity $\xi_x$, it is advantageous to intensity the interaction intensity w between the photoreceptors P, i.e. to increase the values of the interaction intensity w. Examples of a possible dimensioning of the interaction intensity w are described later.

Presented graphically, an intensification of the couplings K by increasing the interaction intensity w means an intensified noise suppression in the individual photoreceptors P. Further, it leads to a reduction of the precision achieved, as a result whereof, greater ruggedness of the photoreceptor arrangement to noise is achieved. Corresponding to the adaptation of the photoreceptor arrangement to the luminous intensity $\xi_x$, an adaptation of the interaction intensity w to the signal-to-noise ratio (SNR) is provided in a development of the photoreceptor arrangement. It is thereby provided that the size of the interaction intensity w is reduced given increasing signal-to-noise ratio.

It is also provided in a development of the photoreceptor arrangement to fashion the interaction intensity w dependent on the statistics of the received signals. What is thereby to be particularly graphically understood is the influence of the statistics of an image to be processed on a filter structure to be approximated by the photoreceptor arrangement. The statistics of the image signals of the registered image also influences the desired filter function realized by the couplings between the photoreceptors P and the photoreceptors P.

In order to suitable simulate the characteristic of the human eye, which exhibits both low passes as well as high passes dependent on the lighting conditions, the following architecture of the photoreceptor arrangement is provided in a development of the photoreceptor arrangement.

Proceeding from the above-described photoreceptor arrangement, additional coupling elements KE are provided. A first input E1 of at least one coupling element KE is coupled to an output A of at least one photoreceptor P.

This means that the output signal $\alpha_x$ of the photoreceptor P is respectively supplied to a coupling element KE. Further, the coupling elements KE are likewise coupled to one another via couplings, which are referenced as coupling element couplings KEK below. The coupling element couplings KEK can likewise be fashioned variable. the intensity of the coupling element couplings KEK is referenced as intermediate interaction intensity u (see FIG. 2).

The respective output signal $\alpha_x$ of the photoreceptor P is supplied to the respective coupling element KE arbitrarily weighted, for example with the weighting value 1. Further, at least one adder unit AE is provided that is coupled both to a respective output A of the photoreceptor P as well as to an output AKE of the respective coupling element KE. This means that an output signal of the coupling element KE is respectively supplied to a first input AE1 of the adder unit AE. Further, the output signal $\alpha_x$ of the respective photoreceptor P is supplied via a second input AE2 of the respective adder unit AE. The signals are again supplied with arbitrary weighting, for example the weighting with the value 1, to the adder unit AE.

It is provided in a development of the photoreceptor arrangement to supply the output signals of the coupling elements KE to the adder unit AE negatively weighted with a weighting factor v.

For the development of the photoreceptor arrangement that the output signal $\alpha_x$ of the respective photoreceptor P is supplied to the adder unit AE weighted with the value 1 and the output signal of the respective coupling element is supplied to the adder unit AE negatively weighted with the weighting factor v, the following rule derives for the response behavior of the overall system $G^{uvw}(k)$, i.e. of the overall photoreceptor arrangement, in the frequency space:

$$G^{uvw}(k) = G_{NN}^{w}(k) \cdot (1 - v \cdot G_{NN}^{u}(k)) \quad (4)$$

In this way, it is possible to generate both low passes as well as high passes merely by a realization of low passes.

Figure 3:
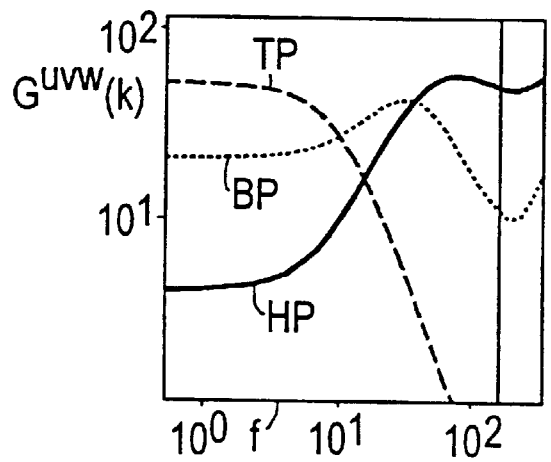
FIG. 3 is an overview of various filter types that can be realized with the architecture of the photoreceptor arrangement shown in FIG. 2.

FIG. 3 shows various filters that can be realized with the photoreceptor arrangement over a frequency f by way of example.

For example, a high pass HP is realized with the following values for the prescribable parameters of the photoreceptor arrangement:

interaction intensity w: 0.3.

intermediate interaction intensity u: 0.9, and weighting factor v: 0.095.

For realizing a low pass TP, for example, the following parameter values can be selected:

interaction intensity w: 0.99, intermediate interaction intensity u: 0.2, and weighting factor v: 0.095.

For realizing a band pass BP, for example, the following parameters can be selected:

interaction intensity w: 0.9, intermediate interaction intensity u: 0.88, and weighting factor v: 0.095.

It can already be seen from this overview that the weighting factor v need not be varied for many filter types, i.e. can be kept constant.

The above-described parameter values are merely to be understood as an example.

The couplings K between the photoreceptors P and the coupling element couplings KEK between the coupling elements KE can be realized in various ways.

For example, it is provided that the couplings K as well as the coupling element couplings KEK be fashioned as electrical lines.

Further, however, it is likewise provided to realize the couplings K and/or coupling element couplings KEK in that the photoreceptors P and/or the coupling elements KE are applied on a variable-conductivity substrate. Such a realization of photoreceptors P on a substrate, but with fixed conductivity, is known from the reference J. Heeger et al., Image Enhancement with Polymer Grid Triode Arrays, Science, Vol. 270, pp. 1642–1644, (1995).

However, the specific architecture that was described above in a development of the photo arrangement is not taught by this reference.

It is provided in a development of the photoreceptor arrangement to respectively provide only couplings K or, respectively, coupling element couplings KEK for every coupling element KE or, respectively, for every photoreceptor P in a prescribable surrounding of the respective photoreceptor P or, respectively, coupling element KE. As a result thereof, the wiring outlay for the couplings K or, respectively, the coupling element couplings KEK is substantially reduced.

For a photoreceptor P or, respectively, for a coupling element K, it is also provided in a development to provide only couplings K between directly neighboring photoreceptors P or, respectively, only coupling element couplings KEK between directly neighboring coupling elements KE.

The photoreceptor arrangement can be very advantageously employed, for example, in a video chip for technical vision, for image pre-processing and/or for efficient display and transmission of images.

One advantage of the photoreceptor arrangement is the universal employability due to the possibility of adapting the photoreceptor arrangement to very different ambient conditions.

Further advantages are comprised, for example, therein that a desired noise suppression can already ensue at the earliest possible stage by connecting the photoreceptor couplings, and that the necessary dynamic range of the photoreceptors and of the output elements given the development of the photoreceptor arrangement with the further processing layers can be reduced due to the overall filter that is formed by the photoreceptor arrangement.

Only a slight bit depth is thus required in a possibly following digitalization. A reduction of the arising data sets can be achieved by this on-chip processing.

Further, images can be filtered in real time due to the fast analog functioning of the photoreceptor arrangement, and a later digital filtering that consumes calculating time thereby becomes superfluous.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A photoreceptor arrangement for receiving light rays, comprising:
   at least two photoreceptors with which light rays that impinge the photoreceptor arrangement are detected and converted into electrical signals;
   the at least two photoreceptors being coupled to one another;
   the coupling of the at least two photoreceptors being a variable coupling;
   at least one coupling element that is respectively coupled to an output of a corresponding photoreceptor for at least a part of the photoreceptors;
   coupling elements being variably coupled to one another;
   an output of at least a part of the coupling elements coupled to a first input of a respective adder unit; and
   at least a part of the outputs of the corresponding photoreceptors coupled to a second input of the adder unit.

2. The arrangement according to claim 1,
   wherein the coupling of the at least two photoreceptors is dependent on luminous intensity of the light rays incident on the arrangement, and
   wherein the coupling of the at least two photoreceptors becomes more intense with decreasing luminous intensity.

3. The arrangement according to claim 1,
   wherein the coupling of the at least two photoreceptors is dependent on signal-to-noise ratio of the light rays incident on the arrangement, and
   wherein the coupling of the at least two photoreceptors becomes more intense with decreasing signal-to-noise ratio.

4. The arrangement according to claim 1,
   wherein the coupling of the at least two photoreceptors is dependent on semantics of an image that is formed by the light rays.

5. The arrangement according to claim 1,
   wherein the at least two photoreceptors are respectively arranged at a common spacing from one another.

6. The arrangement according to claim 1,
   wherein a respective photoreceptor is coupled only to photoreceptors in a surrounding area of the respective photoreceptor the surrounding area having a predetermined size.

7. The arrangement according to claim 6,
   wherein a respective photoreceptor is coupled only to photoreceptors arranged directly neighboring the respective photoreceptor.

8. The arrangement according to claim 1,
   wherein a substrate is provided via which the photoreceptors are coupled to one another, and
   wherein the substrate has a variable conductivity.

9. The arrangement according to claim 8,
   wherein the coupling of the coupling elements to the first input of the adder unit is respectively structured such that output signals of the coupling elements are supplied to the adder unit inverted and arbitrarily weighted.

10. The arrangement according to claim 1, wherein the arrangement is utilized in a video chip.

* * * * *